United States Patent
Liu et al.

(10) Patent No.: US 8,122,328 B2
(45) Date of Patent: Feb. 21, 2012

(54) BOSE-CHAUDHURI-HOCQUENGHEM ERROR CORRECTION METHOD AND CIRCUIT FOR CHECKING ERROR USING ERROR CORRECTION ENCODER

(75) Inventors: Wei Liu, Gyeonggi-do (KR); Won-Yong Sung, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1175 days.

(21) Appl. No.: 11/866,947

(22) Filed: Oct. 3, 2007

(65) Prior Publication Data

US 2008/0244362 A1    Oct. 2, 2008

(30) Foreign Application Priority Data

Mar. 30, 2007    (KR) ........................ 10-2007-0031929

(51) Int. Cl.
*H03M 13/00*    (2006.01)
(52) U.S. Cl. ....................................................... 714/782
(58) Field of Classification Search .................... 714/782
See application file for complete search history.

(56) References Cited

U.S. PATENT DOCUMENTS

| 6,954,892 B2 | 10/2005 | Lee et al. | |
| 7,653,862 B2 * | 1/2010 | Hassner et al. | 714/767 |
| 2004/0168101 A1 * | 8/2004 | Kubo | 714/6 |
| 2004/0181735 A1 | 9/2004 | Xin | |
| 2005/0188292 A1 * | 8/2005 | Chen | 714/768 |
| 2009/0204871 A1 * | 8/2009 | Eggleston et al. | 714/763 |

FOREIGN PATENT DOCUMENTS

| JP | 1995-312560 | 11/1995 |
| JP | 2002-185334 | 6/2002 |
| KR | 2006-0022144 | 3/2006 |

OTHER PUBLICATIONS

Chen, et al. "Area Efficient Parallel Decoder Architecture for Long BCH code" IEEE International conference on Acoustics, Speech, and Signal Processing, 2004. one page.
English language abstract of Japanese Publication No. 1995-312560.
English language abstract of Japanese Publication No. 2002-185334.
Slim Boumaiza, Technical Chair, SiPS, "Signal Processing Systems Design and Implementation" IEEE Workshop Banff, Canada, Oct. 2-6, 2006. 20 pages.
Wei Liu, et al. "Low-Power High-Throughput BCH Error Correction VLSI Design for Multi-Level Cell NAND Flash Memories" IEEE 2006, pp. 248-253.

* cited by examiner

*Primary Examiner* — Scott Baderman
*Assistant Examiner* — Enam Ahmed
(74) *Attorney, Agent, or Firm* — Muir Patent Consulting, PLLC

(57) ABSTRACT

A Bose-Chaudhuri-Hocquenghem (BCH) error correction circuit and method including storing normal data and first parity data in a memory cell array, the normal data and first parity data forming BCH encoded data; generating second parity data from the stored normal data; comparing the first parity data with the second parity data; and checking for an error in the normal data in response to the comparing.

19 Claims, 13 Drawing Sheets

BOSE-CHAUDHURI-HOCQUENGHEM ERROR CORRECTION METHOD AND CIRCUIT FOR CHECKING ERROR USING ERROR CORRECTION ENCODER

CROSS-REFERENCE TO RELATED PATENT APPLICATIONS

This application claims the benefit of Korean Patent Application No. 10-2007-0031929, filed on Mar. 30, 2007, in the Korean Intellectual Property Office, the disclosure of which is incorporated herein in its entirety by reference.

BACKGROUND

1. Technical Field

This disclosure relates to a semiconductor device, and more particularly, to a Bose-Chaudhuri-Hocquenghem (BCH) error correction method and circuit capable of correcting an error by using an encoder, thereby reducing a time, power, and the chip layout size required for error correction.

2. Description of the Related Art

FIG. 1 is a block diagram of a conventional semiconductor chip 100 having an error correcting circuit and a flash memory. Referring to FIG. 1, the semiconductor chip 100 includes a flash memory 120 and an error correcting circuit 140. The semiconductor chip 100 may be connected to an external circuit (not shown) via a bus 200. The error correcting circuit 140 includes a control circuit 141, an error correction encoding circuit 142, and an error correction decoding circuit 143.

The error correction encoding circuit 142 receives normal data NDTA that is to be stored in flash memory cell array 120, and generates corresponding parity data PDTA. The normal data NDTA and the parity data PDTA are respectively stored in a normal data region (not shown) and a parity data region (not shown) of the flash memory cell array 120.

The error correction decoding circuit 143 detects and corrects an error in the normal data NDTA when reading the normal data NDTA from the memory cell array 120.

In this case, error correction may be performed using the BCH (Bose-Chaudhuri-Hocquenghem) error correction algorithm. The BCH error correction algorithm is capable of correcting multiple bits of error in a data block, and thus has been widely applied to error correction of communication systems and memory systems.

In particular, in the case of a multi-level cell flash memory device that stores multiple bits in a cell, bit errors are likely to occur. Thus, error correction can be performed using the BCH error correction algorithm capable of correcting multiple bits of error.

Error correction using the BCH algorithm, and particularly, error correction using binary BCH 4148, 4096 code data (hereinafter referred to as "BCH code data") will be described in detail. Such data is referred to as "BCH code data" or "BCH encoded data"; however, BCH encoded data may have a different length than BCH 4148, 4096 code data.

In general, in error correction using the BCH algorithm, BCH code data is generated using an error correcting encoder, and decoded using an error correcting decoder. Specifically, the BCH code data is decoded by calculating syndromes, constructing an error locator polynomial using the syndromes, and calculating the locations of error bits by obtaining the root of the error locator polynomial. In particular, in order to decode binary BCH code data, an error is corrected by inverting the bit value of an error bit.

FIG. 2 is a conceptual diagram illustrating the format of BCH code data CDATA. Referring to FIG. 2, the BCH code data CDTA consists of 512-byte normal data NDTA and 7-byte parity data PDTA. The parity data PDTA may consist of 48-bit parity and 4-bit dummy data.

FIG. 3 is a diagram illustrating the format of a plurality of pieces of normal data and a plurality of pieces of normal data that are stored within one page of a NAND flash memory. In particular, FIG. 3 illustrates a page PAGE# with a 2K byte normal data region NStorage and 64 byte parity data region PStorage. Accordingly, four pieces of 512-byte normal data NDTA0 through NDTA3 and four pieces of parity data P0 through P3 that are respectively correspond to the normal data NDTA0 through NDTA3, are stored in the page PAGE#.

The BCH code data CDTA is calculated by the error correction encoding circuit 143 of FIG. 1, using an operation on a Galois Field. The BCH code data CDTA consist of the elements of the following primitive polynomial on a Galois Field (GF) $2^{13}$:

$$P(x) = x^{13} + x^4 + x^3 + x + 1 \qquad (1)$$

A generation polynomial for generating 4-bit BCH code data on the GF $2^{13}$ is given by:

$$\begin{aligned}G(x) &= g_{52}x^{52} + g_{51}x^{51} + \ldots + g_1 x + g_0 \\ &= x^{52} + x^{50} + x^{46} + x^{44} + x^{41} + x^{37} + x^{36} + x^{30} + x^{25} + x^{24} + x^{23} + \\ &\quad x^{21} + x^{19} + x^{17} + x^{16} + x^{15} + x^{10} + x^9 + x^7 + x^5 + x^3 + x + 1\end{aligned} \qquad (2)$$

Random 512-byte normal data NDTA# [$d_{4095}, d_{4094}, \ldots, d_1, d_0$] may be expressed as the following polynomial:

$$NDTA\# = d_{4095}x^{4095} + d_{4094}x^{4094} + \ldots + d_1 x + d_0 \qquad (3)$$

In this case, remainder bits [$R_{51}, R_{50}, \ldots, R_1, R_0$] are obtained as parity data by dividing the normal data NDTA# expressed in Equation (3) by the generation polynomial expressed in Equation (2).

A multiplication on the Galois Field may be performed using shift registers. A scheme for generating BCH code data using shift registers is illustrated in FIG. 4.

FIG. 4 is a diagram illustrating an example of the error correction encoding circuit 142, illustrated in FIG. 1, which uses shift registers. Referring to FIG. 4, the error correction encoding circuit 142 includes a plurality of registers r0 through r51, a plurality of XOR gates, and a switch SW. If 4096-bit normal data NDTA [4095:0] are sequentially input to the error correction encoding circuit 142, the bits of parity data are respectively stored in the corresponding registers r0 through r51. The error correction encoding circuit 142 generates 52-bit parity data PDTA[51:0], and parity data PDTA [51:0]) with the input 4096-bit normal data NDTA[4095:0] (that is, it opens a switch SW), and outputs 4148-bit BCH code data CDTA[4147:0].

The error correction encoding circuit as illustrated in FIG. 4 can be embodied in parallel. If the error correction encoding circuit has a parallel structure in which 8 bits are processed at a time, it is possible to produce BCH code data for 4096-bit normal data just within 512 cycles of time.

Referring to FIGS. 1 and 3, the error correction encoding circuit 142 may further include flag registers 145 for error correction, and an RAM block 144 that temporarily stores an "OK" flag, a "FAIL" flag, and data.

The error correction encoding circuit 142 stores first parity data P1 for first normal data NDTA1 in the RAM block 144, and generates second parity data P2 for second normal data NDTA2. If all the first parity data P1 to fourth parity data are generated, 4 pieces of normal data NDTA1 through NDTA4 and the 4 pieces of the parity data P1 through P4 are stored in the flash memory cell array 120.

After the BCH code data is stored, when a read command is received, it is determined whether an error is contained in data that is to be read. If an error exists, the error is corrected, and then, the data is output. Next, a BCH error correction method that uses an error correction decoding circuit when reading data from a memory cell array, will be described.

FIG. 5 is a schematic block diagram of the conventional error correction decoding circuit 143 of FIG. 1. FIG. 6 is a flowchart illustrating a BCH error correction method 600 using the error correction decoding circuit 143 illustrated in FIG. 5.

Referring to FIGS. 5 and 6, the conventional error correction decoding circuit 143 includes a syndrome generator 143*a*, a Berlekamp-Massey executing unit 143*b* a Chien search unit 143*c*, and an error corrector 143*d*. First, BCH code data CDTA' stored is input to the syndrome generator 143*a* of the error correction decoding circuit 143 (operation S610). For convenience of explanation, the BCH code data CDTA' input to the error correction decoding circuit 143 will now be referred to as "received code data".

Assuming that the received code data R(x) is [rn-1, r n-2, ..., r1, r0], the received code data R(x) may be expressed as follows:

$$R(x) = r_{n-1}x^{n-1} + r_{n-2}x^{n-2} + \ldots + r_1 x + r_0, r_j \in GF(2) \quad (4)$$

The syndrome generator 143*a* produces syndromes, for error checking, from the received code data R(x) expressed in Equation (4) (operation S620). The syndrome generator 143*a* may produce the syndrome using the following equation:

$$S_j = r(\alpha^j) = \sum_{k=0}^{n-1} r_k (\alpha^j)^k, (1 \le j \le 2t = 2 \times 4 = 8) \quad (5)$$

It is determined whether an error occurs based on the syndrome $S_j$ illustrated in Equation (5) (operation S630). If an error does not occur, the syndrome $S_j$ has a value of 0. If an error occurs, the syndrome $S_j$ has a value other than 0.

The syndrome generator 143*a* continuously performs a GF multiplication for calculating Equation (5). However, the syndrome generator 143*a* applies Equation (5) to each bit of the received code data R(x) expressed in Equation (4). Thus, in order to calculate syndromes for 4148-bit BCH code data, the syndrome generator 143*a* must perform the GF multiplication 4148 times.

Referring to FIGS. 5 and 6, when an error is detected, the Berlekamp-Massey executing unit 143*b* calculates an error locator polynomial $\Lambda(\alpha^{-i})$ (operation S640). The error locator polynomial $\Lambda(\alpha^{-i})$ may be calculated using the Berlekamp-Massey algorithm.

Next, the Chien search unit 143*c* detects the location of an error bit (operation S650). The location of the error bit may be detected using the Chien search algorithm. The Chien search algorithm detects the location of the error bit, based on whether the error locator polynomial $\Lambda(\alpha^{-i})$ has a value of 0. In this case, i represents the location of the error bit. That is, if the error locator polynomial $\Lambda(\alpha^{-i})$ has a value of 0, an error occurs in a bit ri of the received code data R(x) expressed in Equation (4).

Similarly to the syndrome generator 143*a*, the Chien search unit 143*c* also performs a GF multiplication. Also, for a Chien search for 4148-bit BCH code data, the Chien search unit 143*c* performs the GF multiplication 4148 times.

If the Chien search reveals the location of the error bit, the error corrector 143*d* corrects the error (operation S660). As described above, the BCH error correction method 600 using binary BCH code data corrects an error by inverting the bit value of an error bit. In the BCH error correction method 600, if error correction is successfully performed, "OK" flag indicating this fact is output (operation S670). If error correction fails, "FAIL" flag indicating this fact is output (operation S680).

FIG. 7 is a timing diagram of the operation of the error correction decoding circuit 143 of FIG. 5. Referring to FIGS. 5 and 7, although only a short latency with 4 cycles is required to perform the SiBM (Simplified inverse-free Berlekamp-Massey) algorithm, each of syndrome generation and Chien search requires much time due to a 4148-bit long latency. As described above, according to a conventional BCH error correcting circuit and method, for syndrome generation and Chien search, a GF multiplication is needed to be performed a number of times corresponding to the bits of BCH code data.

That is, according to a conventional BCH error correcting circuit and method, a large amount of time and power are required to perform decoding for BCH error correction, thereby degrading the performance of a semiconductor memory device.

SUMMARY

An embodiment includes a Bose-Chaudhuri-Hocquenghem (BCH) error correction method capable of simplifying a BCH error correction process, thereby reducing a time and power necessary for error correction.

Another embodiment includes a BCH error correction circuit capable of simplifying a BCH error correction process, thereby reducing a time and power necessary for error correction.

Another embodiment includes a data storage system and a communication system capable of capable of simplifying a BCH error correction process, thereby reducing a time and power necessary for error correction.

Another embodiment includes a BCH error correction method including storing normal data and first parity data in a memory cell array, the normal data and first parity data forming BCH encoded data; generating second parity data from the stored normal data; comparing the first parity data with the second parity data; and checking for an error in the normal data in response to the comparing.

Another embodiment includes a BCH error correction method including encoding at least a portion of BCH encoded data; determining if an error exists in the BCH encoded data in response to the encoding; generating syndromes when it is determined that an error exists; detecting a location of the error using the syndromes; and inverting a bit value at the location of the error.

Another embodiment includes a BCH error correcting circuit including a memory cell array; an error correcting encoder coupled to the memory cell array configured to encode first normal data to generate first parity data, store the first normal data and the first parity data in the memory cell array, encode second normal data read from the memory cell array to generate second parity data, and generate a comparison signal by comparing the first parity data to the second parity data; and an error corrector coupled to the error correcting encoder and configured to correct an error in the second normal data in response to the comparison signal.

BRIEF DESCRIPTION OF THE DRAWINGS

The above and other features and advantages will become more apparent by describing in detail embodiments with reference to the attached drawings in which.

DETAILED DESCRIPTION

Figure 1:
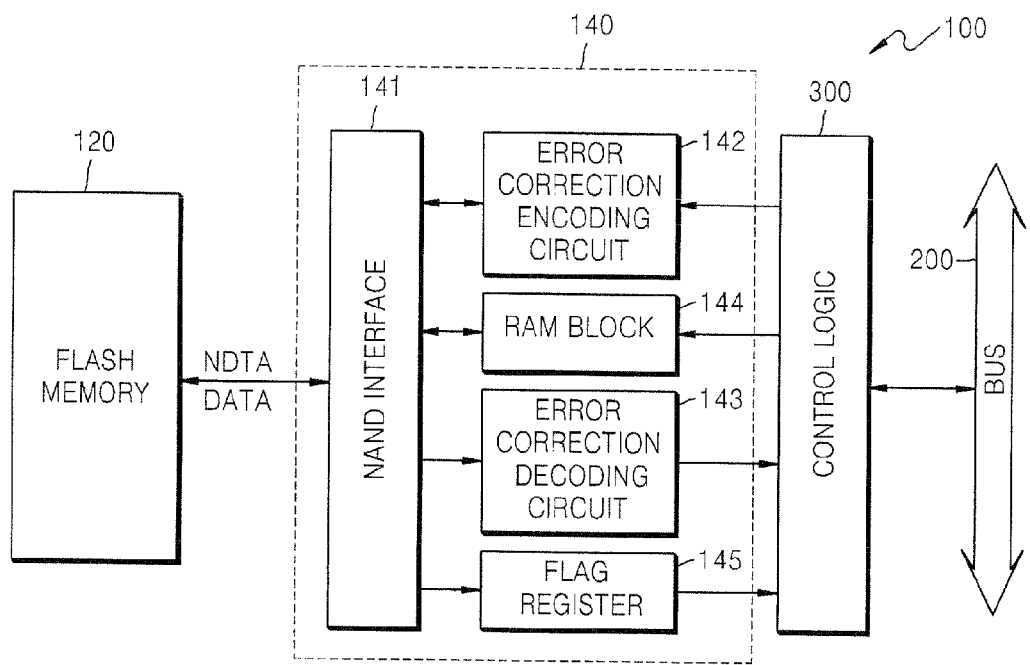
FIG. 1 is a schematic block diagram of a semiconductor chip having an error correcting circuit and a flash memory.
Figure 2:
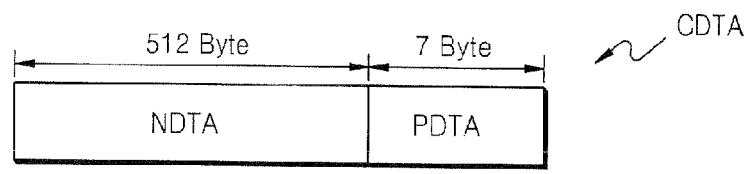
FIG. 2 is a conceptual diagram illustrating the format of Bose-Chaudhuri-Hocquenghem (BCH) code data.
Figure 3:
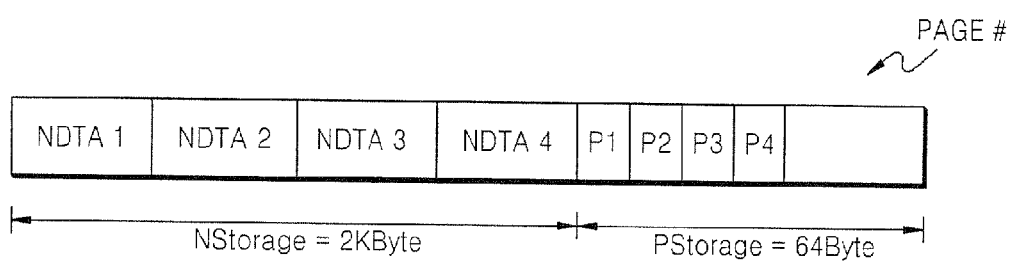
FIG. 3 is a diagram illustrating the format of a plurality of pieces of normal data and a plurality of pieces of parity data stored in one page of a NAND flash memory.

Embodiments will now be described more fully with reference to the accompanying drawings. Like reference numerals denote like elements throughout the drawings.

Figure 8:
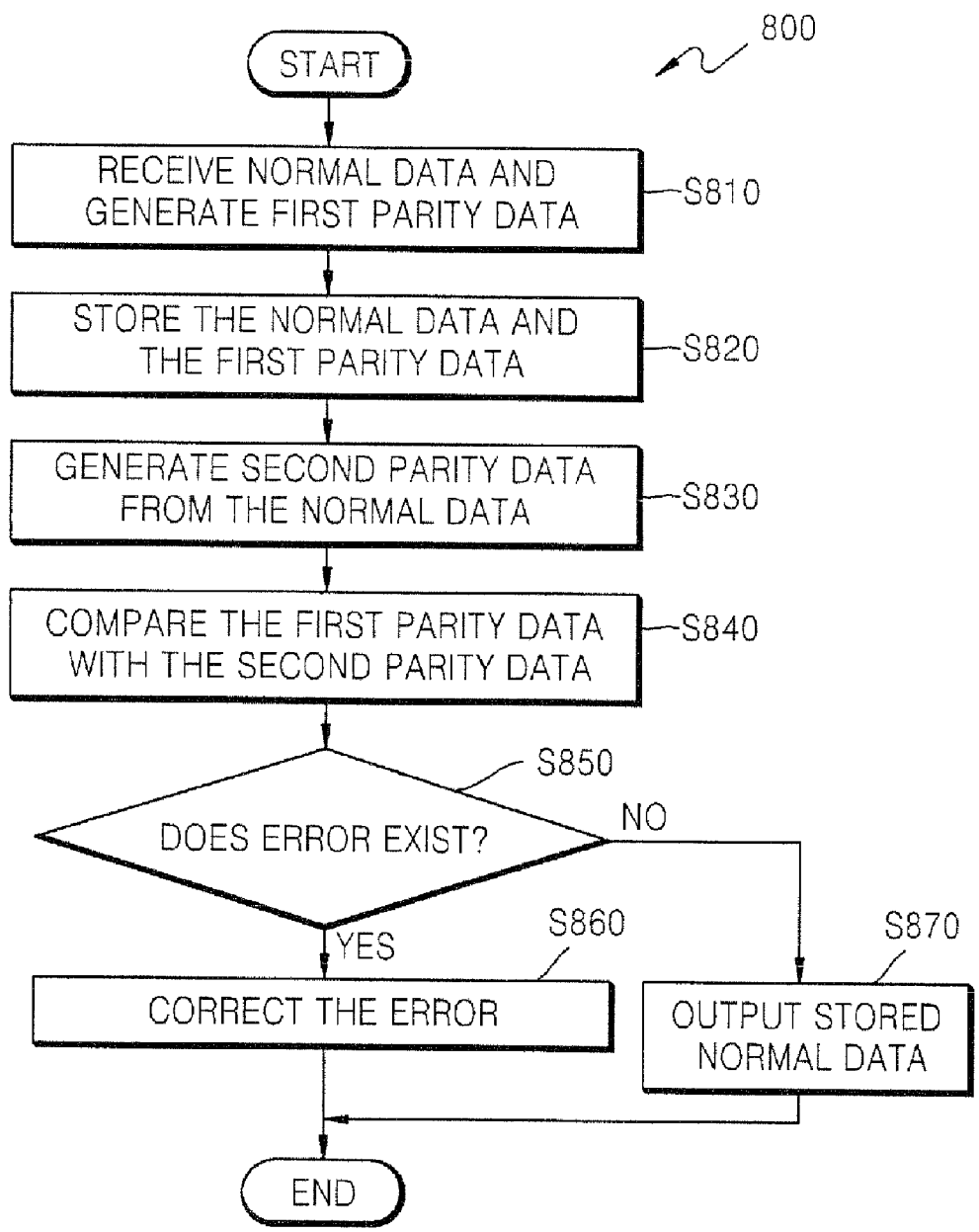
FIG. 8 is a flowchart illustrating a BCH error correction method, according to an embodiment.
Figure 11:
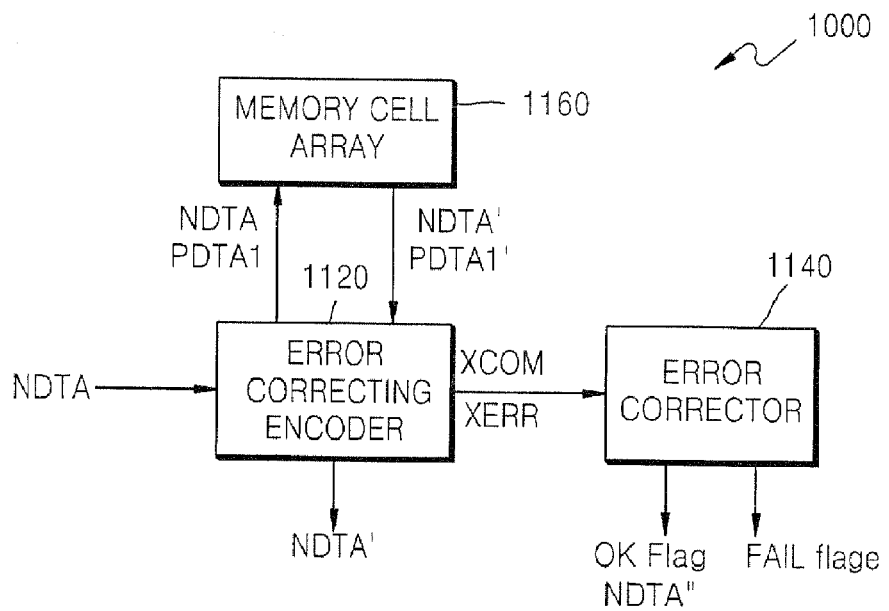
FIG. 11 is a schematic block diagram of a BCH error correcting circuit according to an embodiment.

FIG. 8 is a flowchart illustrating a Bose-Chaudhuri-Hocquenghem (BCH) error correction method 800 according to an embodiment. FIG. 11 is a schematic block diagram of a BCH error correcting circuit 1100 according to an embodiment.

Referring to FIGS. 8 and 11, the BCH error correcting circuit 1100 includes an error correcting encoder 1120 and an error corrector 1140. The error correcting encoder 1120 is configured to receive normal data NDTA that is to be written to a memory cell array 1160, and generate first parity data PDTA1 (operation S810). The error correcting encoder 1120 is configured to write the normal data NDTA and the first parity data PDTA1 to the memory cell array 1160 (operation S820). In this case, the memory cell array 1160 may be a flash memory, and particularly, a multi-level cell NAND flash memory cell array.

Figure 12:
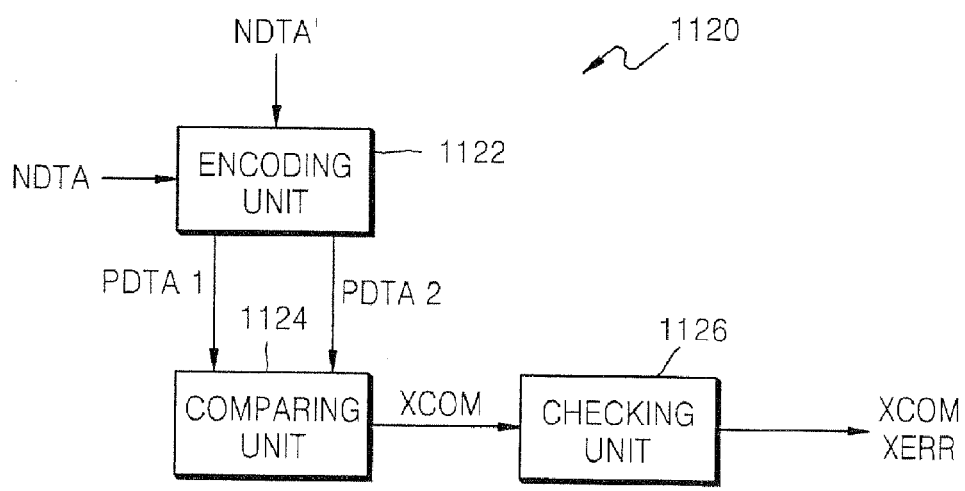
FIG. 12 is a block diagram illustrating in detail an error correcting encoder of FIG. 11, according to an embodiment.

FIG. 12 is a block diagram illustrating in detail the error correcting encoder 1120 of FIG. 11. Referring to FIGS. 8, 11, and 12, the error correcting encoder 1120 includes an encoding unit 1122, a comparing unit 1124, and a checking unit 1126. In the BCH error correction method 800 according to an embodiment, second parity data PDAT2 is generated from normal data NDTA' that was read from the memory cell array 1160 (operation S830).

The encoding unit 1122 is capable of producing the second parity data PDTA2 by encoding the normal data NDTA' stored in the memory cell array 1160. For example, the normal data NDTA'[$d_{4095}'$, $d_{4094}'$, . . . , $d_1'$, $d_0'$] input to the encoding unit 1122 is encoded again so as to produce the second parity data PDTA2 [$R_{51}'$, $R_{50}'$, . . . , $R_1'$, $R_0'$].

The comparing unit 1124 is configured to compare the first parity data PDTA1 with the second parity data PDTA2 (operation S840). The checking unit 1126 is configured to check an error using the result of comparison XCOM (operation S850).

That is, according to an embodiment, in the BCH error correction method 800 and the BCH error correcting circuit 1100, the error correcting encoder 1120 can be used to determine whether an error is contained in the normal data NDTA' written to the memory cell array 1160 (operation S850).

In an example, in the BCH error correction method 800 and the BCH error correcting circuit 1100, it is determined whether the first parity data PDTA1 is identical to the second parity data PDTA2. When PDTA1 and PDTA2 are not the same, it is determined that no error occurs in the normal data NDTA'. In detail, the result of comparison XCOM of the first parity data PDTA1 with the second parity data PDTA2 may be represented as the difference [$R_{51}-R_{51}'$, $R_{50}-R_{50}'$, . . . , $R_1-R_1'$, $R_0-R_0'$] between the first parity data PDTA1 [$R_{51}$, $R_{50}$, . . . , $R_1$, $R_0$] and the second parity data [$R_{51}'$, $R_{50}'$, . . . , $R_1'$, $R_0'$].

If the result of comparison XCOM has a value other than 0, that is, when an error occurs, the checking unit 1126 transmits an error signal XERR to the error corrector 1140. The error corrector 1140 corrects the error in the normal data NDTA' written to the memory cell array 1160, in response to the error signal XERR (S860).

Figure 9:
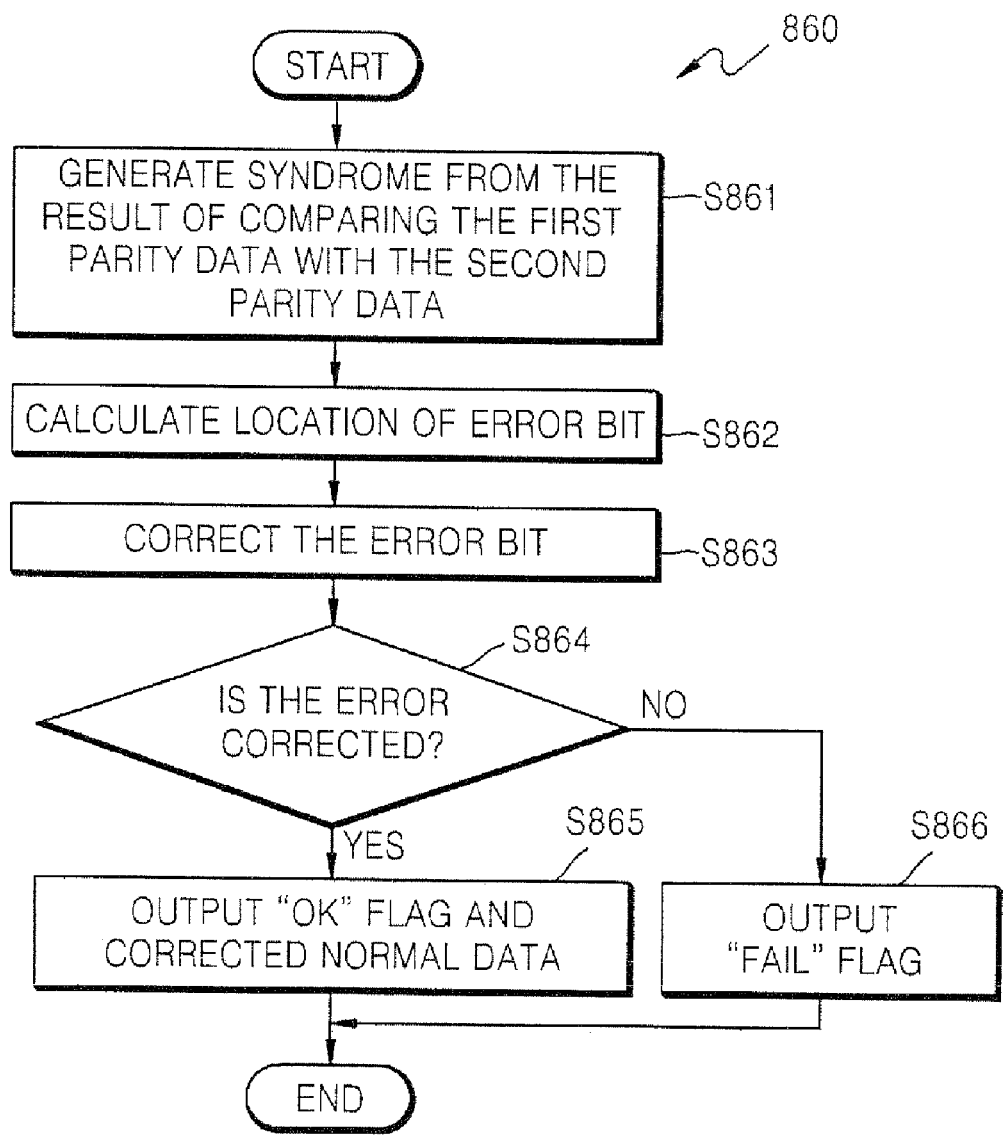
FIG. 9 is a flowchart illustrating in detail an operation of error correcting illustrated in FIG. 8, according to an embodiment.
Figure 13:
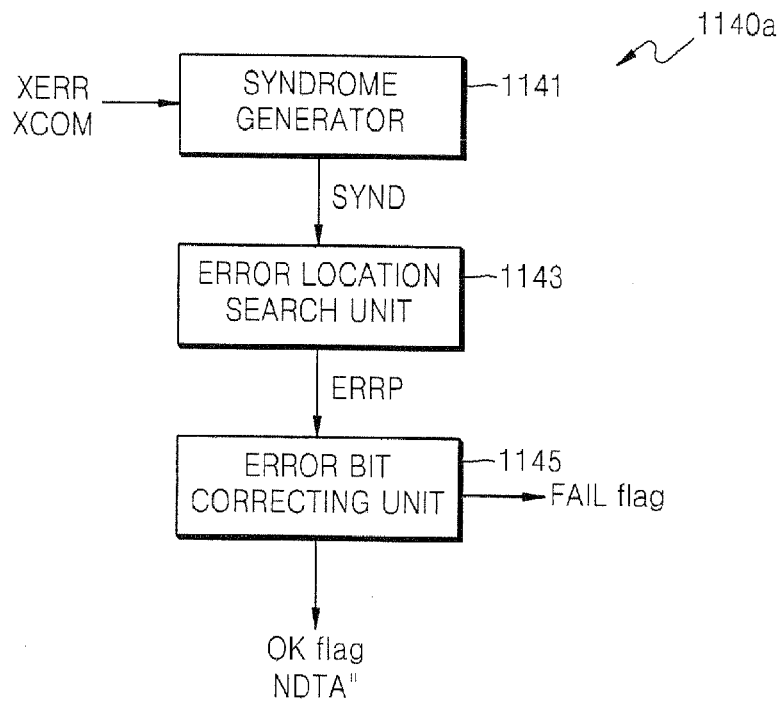
FIG. 13 is a block diagram of an example of an error corrector of FIG. 11.

FIG. 9 is a flowchart illustrating in detail of operation S860 of correcting an error, of FIG. 8, according to an embodiment. FIG. 13 is a block diagram of an error corrector 1140a that is an example of the error corrector 1140 of FIG. 11. Referring to FIGS. 9 and 13, the error corrector 1140a includes a syndrome generator 1141, an error location search unit 1143, and an error bit correcting unit 1145. The syndrome generator 1141 is configured to generate a syndrome SYND from the result of comparison XCOM, in response to the error signal XERR (operation S861). A formula for generating a syndrome is as illustrated in Equation (5) but the total number of syndromes generated according to the formula is different from when using Equation (5).

Figure 6:
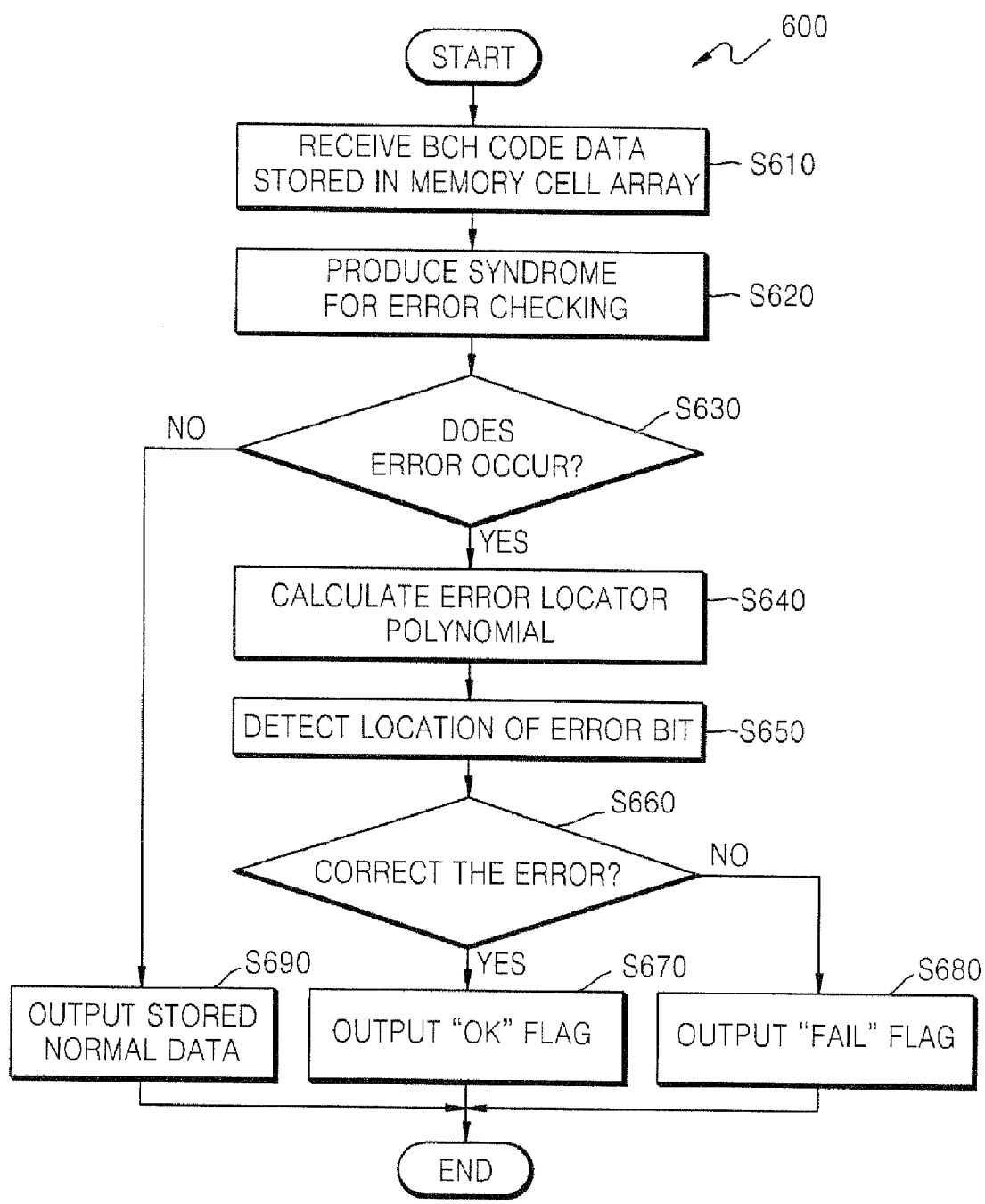
FIG. 6 is a flowchart illustrating a BCH error correction method using the error correction decoding circuit of FIG. 5.

As described above, the result of comparison XCOM is [$R_{51}-R_{51}'$, $R_{50}-R_{50}'$, . . . , $R_1-R_1'$, $R_0-R_0'$], that is, it is just a 52 bit long. Thus, in a BCH error correction method according to an embodiment, syndromes for only 52 bits are generated. In contrast, a conventional BCH error correction method, syndromes are generated by applying Equation (5) to all the bits of 4148-bit BCH code data CDTA (see FIGS. 1 and 6). Accordingly, an amount of time required for error correction (see FIGS. 8 and 11) in a BCH error correction method according to an embodiment is reduced relative to the conventional BCH error correction method.

Figure 15:
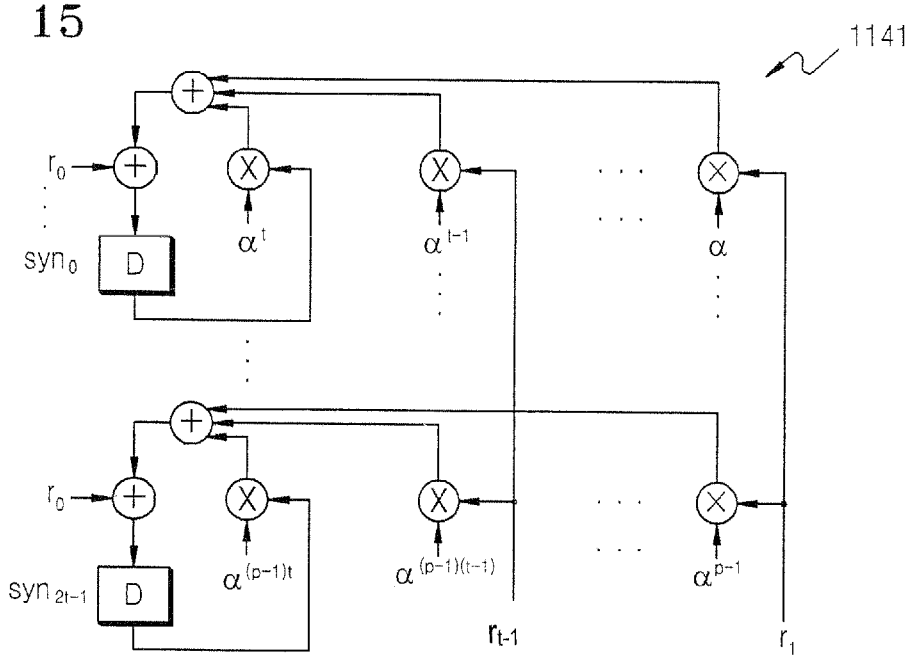
FIG. 15 is a circuit diagram of a parallel syndrome generator according to an embodiment.

A BCH error correction method and circuit according to an embodiment are also capable of generating in parallel a plurality of syndromes for multiple bits. A parallel syndrome generator according to an embodiment is illustrated in FIG. 15.

Figure 4:
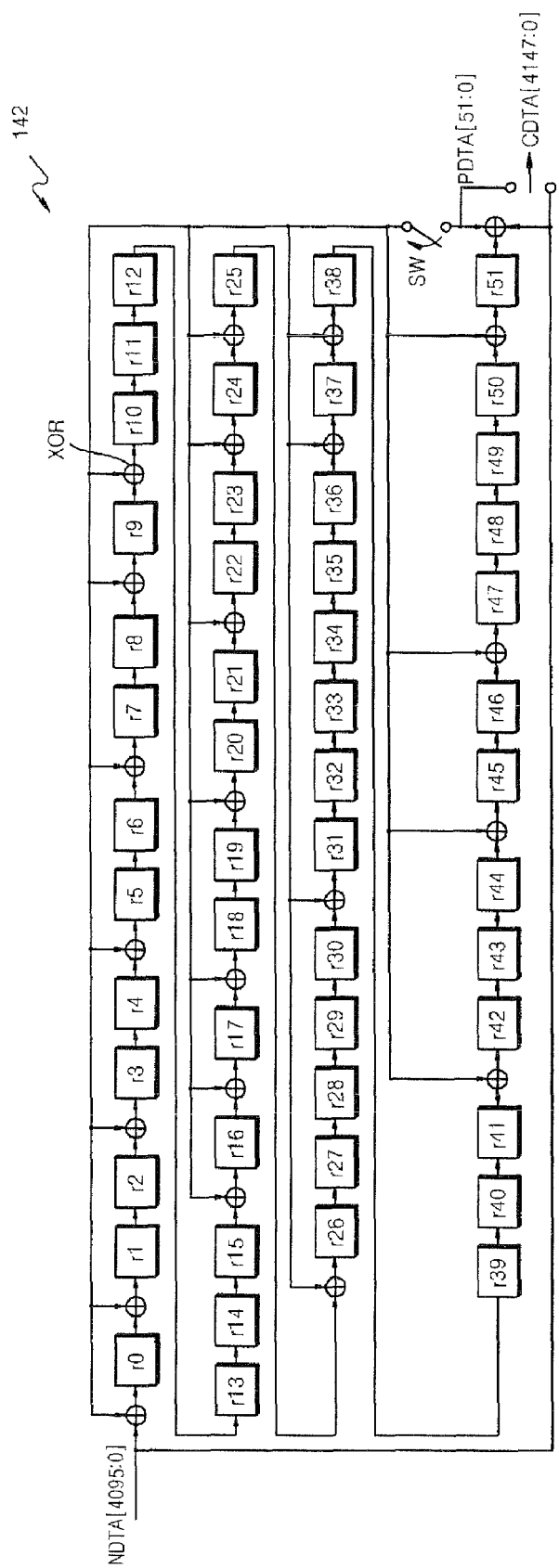
FIG. 4 is a diagram illustrating an example of an error correction encoding circuit, of FIG. 1, which uses shift registers.
Figure 5:
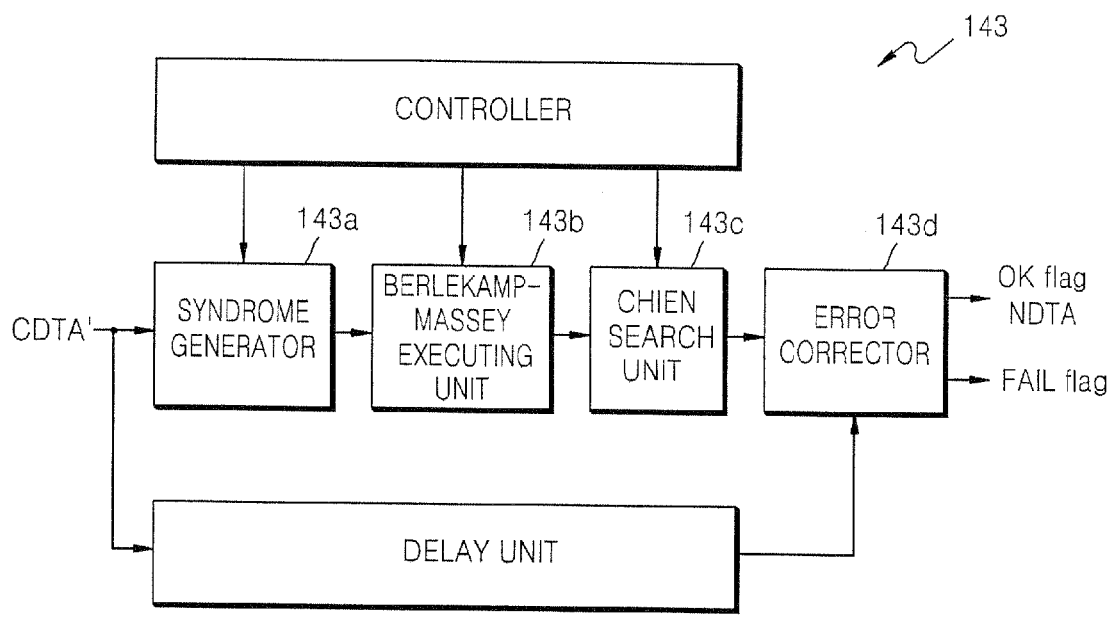
FIG. 5 is a schematic block diagram of a conventional error correction decoding circuit illustrated in FIG. 1.

A BCH error correction method and circuit according to an embodiment are capable of generating a plurality of syndromes in parallel since the presence of an error is checked using an error correcting encoder with shift registers (see FIG. 4). As described above, an encoder using shift registers makes it easy to perform parallel processing, thereby allowing an error to be detected in units of bytes.

Accordingly, the BCH error correction method and circuit according to the current embodiment are capable of performing parallel processing for syndrome generation, thereby increasing the performance of error correcting and the efficiency of power.

Referring to FIGS. 9 and 13, the error location search unit 1143 is configured to calculate the location of an error bit using syndromes SYND (S862). In this case, the location of the error bit may be calculated using the Berlekamp-Massey algorithm and the Chien search algorithm. A method of searching for the location of an error bit using the Berlekamp-Massey algorithm and the Chien search algorithm has been described above.

Further, the BCH error correction method and circuit according to an embodiment are capable of performing in parallel the Chien search algorithm for multiple bits. An example of a parallel Chien search block is illustrated in FIG. 16.

Figure 16:
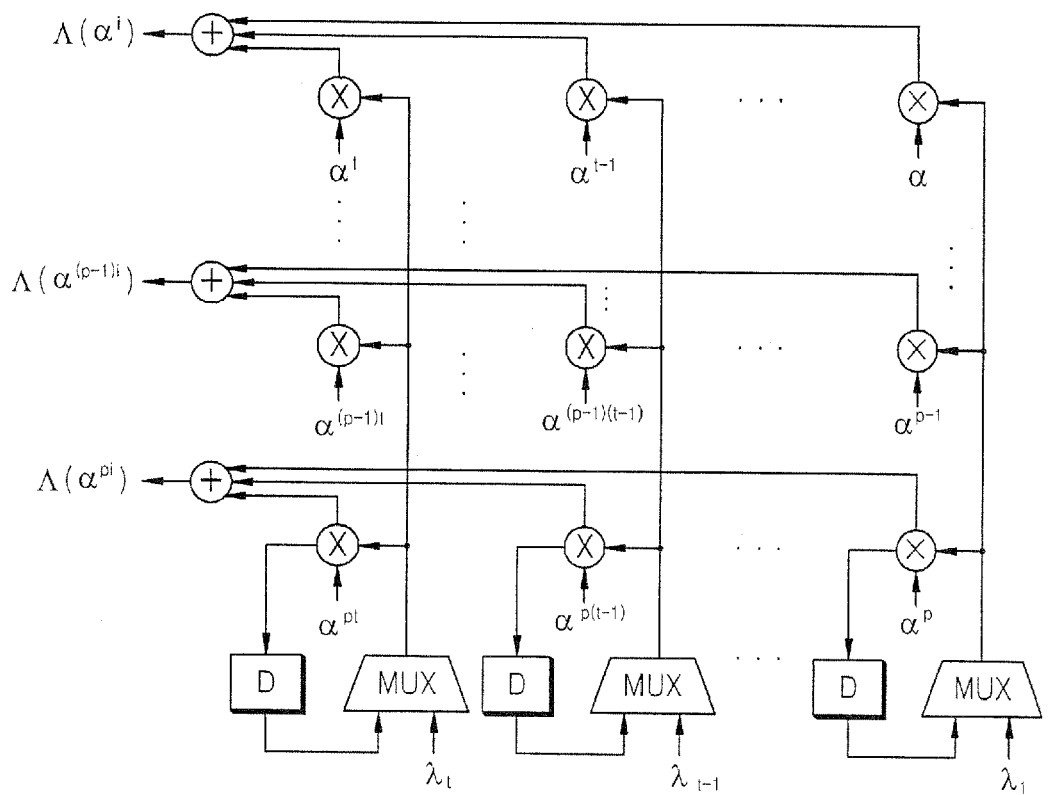
FIG. 16 is a circuit diagram of a parallel Chien search block according to an embodiment.

Similarly to the parallel syndrome generator of FIG. 15, the parallel Chien search block illustrated in FIG. 16 is also capable of performing a Chien search in parallel, thereby increasing the performance of error correcting and the efficiency of power.

Figure 14:
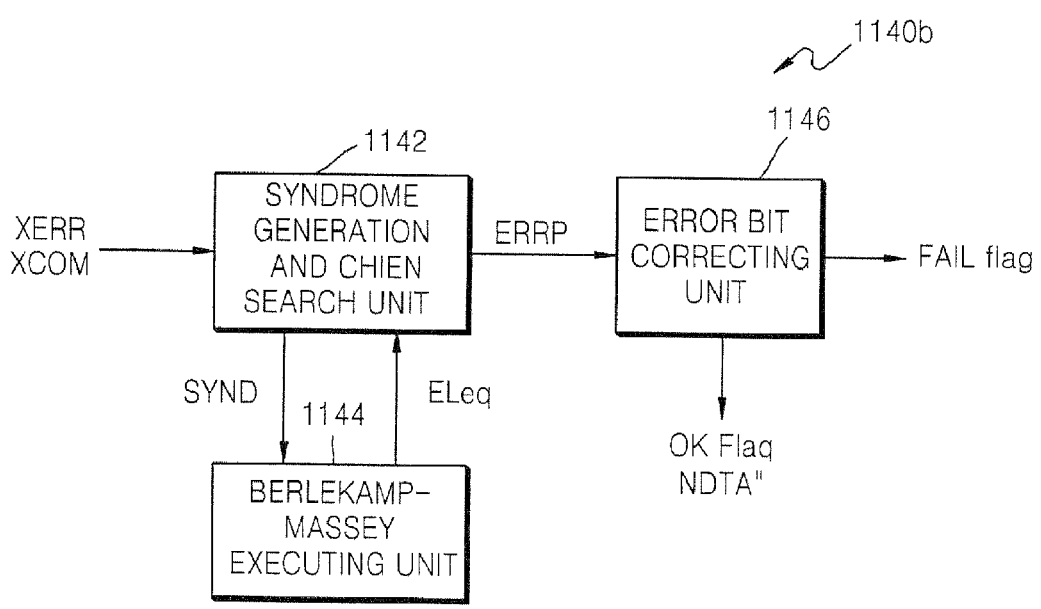
FIG. 14 is a block diagram of another example of an error corrector of FIG. 11.

FIG. 14 is a block diagram of an error corrector 1140b that is another example of the error corrector 1140 of FIG. 11. Referring to FIG. 14, according to an embodiment, the error corrector 1140b includes a syndrome generation-Chien search unit 1142 that is a combination of the syndrome generator 1141 of FIG. 13 and a Chien search unit (not shown). An example of the syndrome generation and Chien search unit 1142, of FIG. 16, which is a combination of the parallel syndrome generator 1141 of FIG. 15 and the parallel Chien search unit 1143 of FIG. 16, is illustrated in FIG. 17.

As described above, both a syndrome generator and a Chien search unit perform a multiplication on a GF. However, according to a BCH error correcting method and circuit according to an embodiment a reduced number of cycles of time is required to generate syndromes, and therefore, it is possible to generate syndromes by time-sharing with the Chien search unit without additional hardware for syndrome generation. Accordingly, it is possible to reduce the layout size of the chip.

Figure 7:
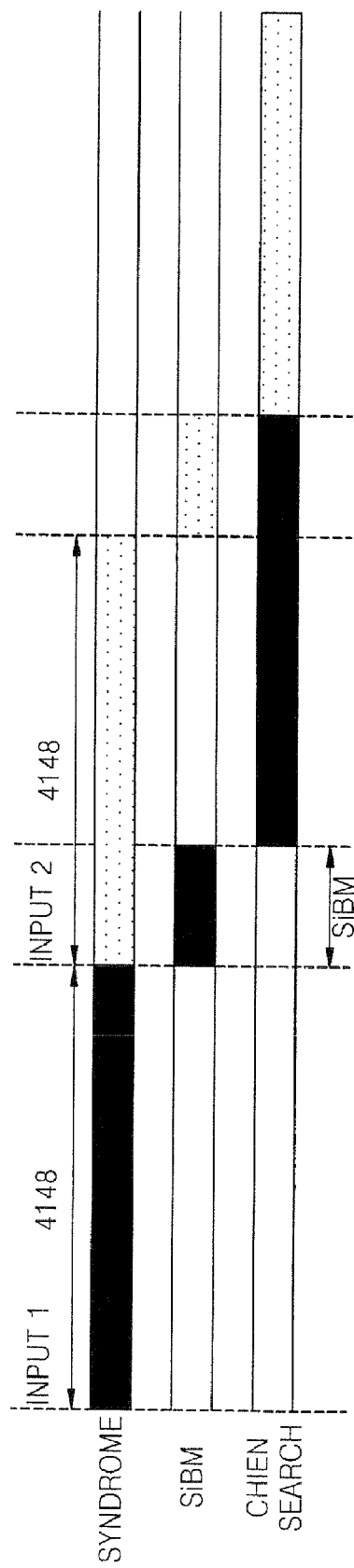
FIG. 7 is a timing diagram of the operation of the error correction decoding circuit of FIG. 5.
Figure 17:
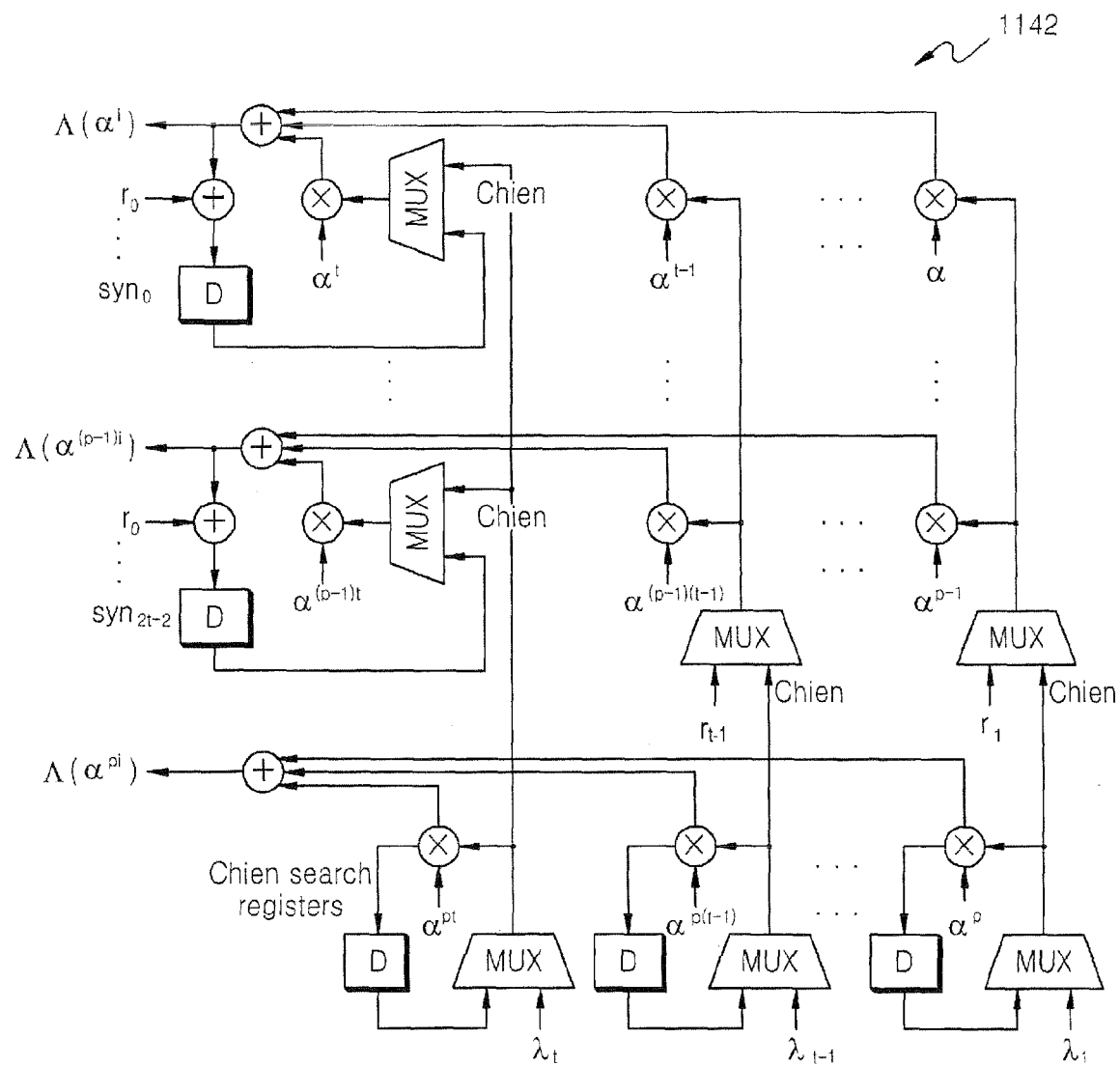
FIG. 17 is a circuit diagram of a syndrome generation and Chien search unit, of FIG. 14, which is a combination of the parallel syndrome generator of FIG. 15 and the parallel Chien search unit of FIG. 16, according to an embodiment.
Figure 18:
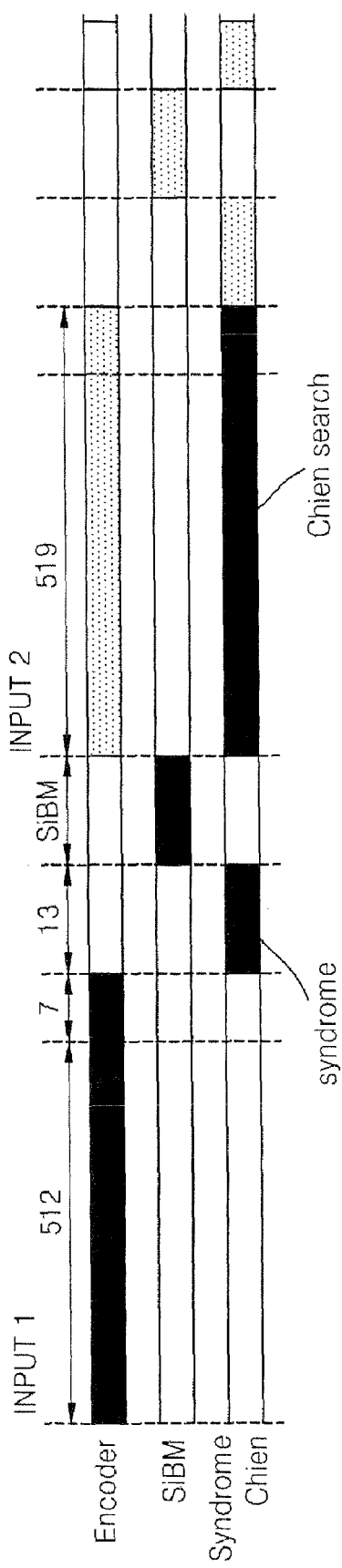
FIG. 18 is a timing diagram illustrating a BCH error correcting operation of the syndrome generation and Chien search unit of FIG. 17, according to an embodiment.

FIG. 18 is a timing diagram illustrating BCH error correcting using the syndrome generation and Chien search unit 1142 of FIG. 17, according to an embodiment. Referring to FIG. 18, when BCH error correcting is processed in parallel with respect to 8 bits, that is, when BCH error correcting is performed in units of bytes, only 519 cycles of time is required. Also, a latency required for syndrome generation is still shorter than as illustrated in FIG. 7.

As described above, in a BCH error correcting method and circuit according to an embodiment, since the presence of an error is detected using an encoder, it is easy to simplify the construction of a circuit for generating syndromes, a latency required for syndrome generation is short, and it is possible to process in parallel multiple bits. Accordingly, it is possible to reduce a time, power, and the chip layout size for error correction.

Referring to FIGS. 9 and 13, the error bit correcting unit 1145 is configured to correct an error by inverting the bit value of the bit of error (operation S863). The error bit correcting unit 1145 is configured to output an "OK" flag and corrected normal data NDTA" when the error is corrected (operation S865), and output a "FAIL" flag when the error is not corrected (operation S866).

Referring to FIGS. 8 and 11, if the result of comparison XCOM of first parity data PDTA1 and second parity data PDTA2 has a value of 0, that is, if an error does not exist, the error corrector 1140 outputs normal data NDTA' stored in memory cell array 1160.

Figure 10:
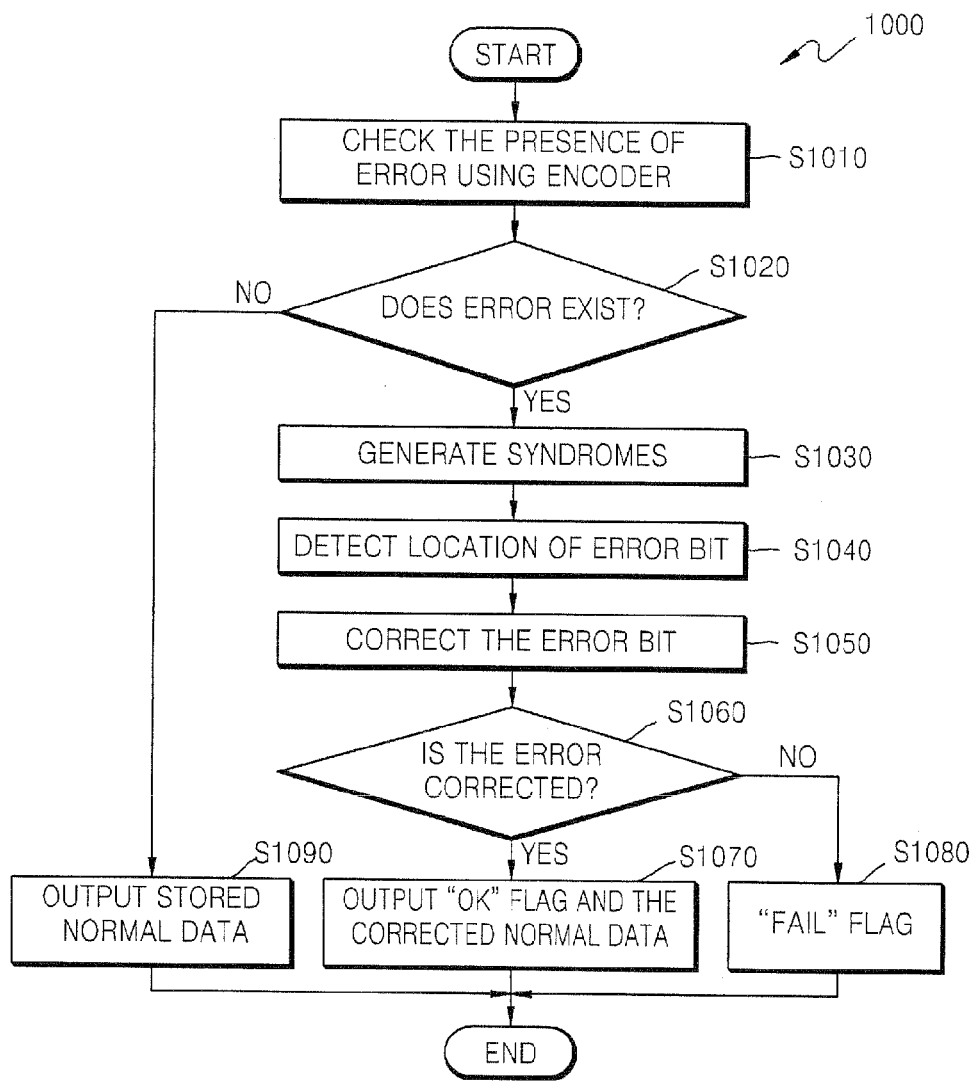
FIG. 10 is a flowchart illustrating a BCH error correction method, according to another embodiment.

FIG. 10 is a flowchart illustrating a BCH error correction method 1000 according to another embodiment. Referring to FIG. 10, the BCH error correction method 1000 includes checking the presence of an error using an encoder (operation S1010), generating syndromes when the error exists (operation S1030), detecting the location of the bit of error using the syndromes (operation S1040), and correcting the error by inverting the bit value of the error bit (operation S1050). Operation S1010 can be similar to operations S810 through S850 of FIG. 8.

As described above, according to an embodiment, in a BCH error correction method and circuit, the presence of an error is checked using an encoder, thereby simplifying the construction of a circuit for syndrome generation, reducing a latency required for syndrome generation, and allowing multiple bits to be processed in parallel. Accordingly, it is possible to reduce a time, power, and the chip layout size for error correction.

While embodiments have been particularly shown and described with reference to the drawings, it will be understood by those of ordinary skill in the art that various changes in form and details may be made therein without departing from the spirit and scope of the present invention as defined by the following claims.

What is claimed is:

1. A Bose-Chaudhuri-Hocquenghem (BCH) error correction method comprising:
   storing normal data and first parity data in a memory cell array, the normal data and first parity data forming BCH encoded data;
   generating second parity data from the stored normal data;
   comparing the first parity data with the second parity data;
   checking for an error in the normal data in response to the comparing, wherein checking for the error comprises determining that the error exists when the first parity data is not identical to the second parity data, and
   when an error exists correcting the error, wherein correcting of the error comprises:
   generating syndromes based on the result of the comparing;
   calculating a location of the error using the syndromes; and
   inverting a bit value at the location of the error,
   wherein calculating the location of the error comprises using Berlekamp-Massey algorithm and a Chien search algorithm.

2. The method of claim 1, wherein generating the second parity data comprises encoding the normal data.

3. The method of claim 1, wherein generating the syndromes comprises:
generating syndromes only for the comparison of the first parity data and the second parity data.

4. The method of claim 1, wherein:
generating the syndromes comprises generating the syndromes in a syndrome generation and Chien search unit; and
calculating the location of the error using the Chien search algorithm comprises calculating the location of the error using the Chien search algorithm in the syndrome generation and Chien search unit.

5. The method of claim 1, further comprising determining whether the correcting of the error is performed properly.

6. The method of claim 5, wherein determining whether the correcting of the error is performed properly comprises generating an OK flag and outputting corrected normal data when the error is corrected, and outputting a FAIL flag when the error is not corrected.

7. The method of claim 1, wherein storing the normal data and the first parity data in the memory cell array comprises storing the normal data and the first parity data in a flash memory cell array.

8. A Bose-Chaudhuri-Hocquenghem (BCH) error correction method comprising:
encoding at least a portion of BCH encoded data;
determining, by a circuit, if an error exists in the BCH encoded data in response to the encoding;
generating syndromes when it is determined that an error exists;
detecting a location of the error using the syndromes; and
inverting a bit value at the location of the error,
wherein determining the location of the error comprises determining the location of the error using a Berlekamp-Massey algorithm and a Chien search algorithm
wherein determining if the error exists comprises:
receiving normal data and first parity data, the normal data and first parity data forming the BCH encoded data;
generating second parity data from the normal data;
comparing the first parity data with the second parity data; and
determining that an error exists in response to the comparing.

9. The method of claim 8, wherein generating the second parity data further comprises encoding the normal data.

10. The method of claim 8, wherein determining that the error exists comprises determining that the error occurred when the first parity data is not identical to the second parity data.

11. A Bose-Chaudhuri-Hocquenghem (BCH) error correcting circuit comprising:
a memory cell array;
an error correcting encoder coupled to the memory cell array configured to encode first normal data to generate first parity data, store the first normal data and the first parity data in the memory cell array, encode second normal data read from the memory cell array to generate second parity data, and generate a comparison signal by comparing the first parity data to the second parity data; and
an error corrector coupled to the error correcting encoder and configured to correct an error in the second normal data in response to the comparison signal, wherein the error corrector comprises:
a syndrome generation and Chien search unit configured to generate syndromes in response to the comparison signal, and calculate the location of the error in response to an error locator polynomial by performing a Chien search algorithm;
a Berlekamp-Massey executing unit coupled to the syndrome generation and Chien search unit and configured to calculate the error locator polynomial by performing the Berlekamp-Massey algorithm; and
an error corrector coupled to the syndrome generation and Chien search unit and configured to correct a bit value at the location of the error.

12. The circuit of claim 11, wherein the error correcting encoder comprises:
an encoding unit configured to encode the first parity data from the first normal data and encode the second parity data from the second normal data;
a comparing unit coupled to the encoding unit and configured to generate the comparison signal by comparing the first parity data with the second parity data; and
a checking unit coupled to the comparing unit and configured to check the presence of an error in response to the comparison signal.

13. The circuit of claim 12, wherein if the first parity data is not identical to the second parity data, the checking unit is configured to transmit an error signal to the error corrector.

14. The circuit of claim 11, wherein the error corrector comprises:
a syndrome generator configured to generate the syndromes in response to the comparison signal;
an error location search unit coupled to the syndrome generator and configured to calculate the location of the error in response to the syndromes; and
an error bit correcting unit configured to correct the error by inverting the bit value at the location of the error.

15. The circuit of claim 14, wherein the error location search unit comprises:
a Berlekamp-Massey executing unit configured to calculate an error locator polynomial; and
a Chien search unit configured to calculate the location of the error in response to the error locator polynomial.

16. The circuit of claim 14, wherein the error bit correcting unit is configured to output an OK flag and corrected second normal data when the error is corrected, and is configured to output a FAIL flag when the error is not corrected.

17. The method of claim 1, wherein the step of generating syndromes comprises generating syndromes only for less than all of the BCH encoded data.

18. The method of claim 8, wherein the step of generating syndromes comprises generating syndromes only for less than all of the BCH encoded data.

19. The circuit of claim 11, wherein the error corrector is configured to generate syndromes only for less than all of the BCH encoded data.

* * * * *